United States Patent
Passaggio et al.

(10) Patent No.: US 6,317,520 B1
(45) Date of Patent: Nov. 13, 2001

(54) NON-REVERSIBLE DIFFERENTIAL PREDICTIVE COMPRESSION USING LOSSY OR LOSSLESS TABLES

(75) Inventors: Filippo Passaggio, Genoa (IT); Torbjörn Einarsson, Stockholm; Per Thorell, Solna, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/413,213

(22) Filed: Oct. 5, 1999

Related U.S. Application Data

(63) Continuation of application No. PCT/SE98/00652, filed on Apr. 8, 1998.

(30) Foreign Application Priority Data

Apr. 11, 1997 (SE) .................................................. 9701351

(51) Int. Cl.⁷ .............................. G06K 9/36; G06K 9/46
(52) U.S. Cl. .......................... 382/238; 382/239; 382/244
(58) Field of Search .................................. 382/232, 238, 382/239, 244; 348/394, 409–419, 394.1, 409.1–419.1; 358/261.2, 430; 341/51, 76, 106, 107; 704/500, 501, 503, 504

(56) References Cited

U.S. PATENT DOCUMENTS

| | | | |
|---|---|---|---|
| 4,791,483 | * 12/1988 | Miller | 348/394 |
| 4,910,594 | * 3/1990 | Kondo | 348/409 |
| 5,757,306 | * 5/1998 | Nomura | 348/414 |
| 5,815,207 | * 9/1998 | Cucchi et al. | 348/409 |
| 6,005,623 | * 12/1999 | Takahashi et al. | 348/416 |

FOREIGN PATENT DOCUMENTS

| | | | |
|---|---|---|---|
| 0 708 552 A2 | 4/1996 | (EP) | H04N/1/41 |
| 63-27001 A | 11/1994 | (JP) | H04N/7/137 |
| 97/03516 A1 | 1/1997 | (WO) | H04N/1/41 |

OTHER PUBLICATIONS

*IEEE Transactions on Image Processing*, Vol. 4, No. 5, May 1995, p. 667, Ying Wang, "A Set of Transformations for Lossless Image Compression".

* cited by examiner

Primary Examiner—Timothy M. Johnson
(74) Attorney, Agent, or Firm—Nixon & Vanderhye P.C.

(57) ABSTRACT

In a method and a device for transforming a stream of digital numbers, the correlation between successive numbers is utilized in order to obtain a new stream having a very low correlation between the numbers, whereby the sequence of numbers can be coded much more efficiently from a compression point of view. The numbers are for this purpose coded with the difference between a predicted number (s'(i)) and the actual number (s(i)) taking into account that the sequence does not need to be possible to decode in reverse order. The non-reversible codes can also be applied in lossy data compression schemes. Such schemes can change in accordance with the currently available bandwidth in order to obtain a graceful degradation and optimal bandwidth usage when the compressed data stream is transmitted over a channel having a time varying bandwidth. A general method and device for reversible coding are also provided.

22 Claims, 4 Drawing Sheets

| s(i) | | | | | | | | | |
|---|---|---|---|---|---|---|---|---|---|
| 7 | 4 | 5 | 7 | 6 | 2 | 3 | 1 | 0 | |
| 6 | 5 | 7 | 6 | 2 | 3 | 1 | 0 | 4 | |
| 5 | 7 | 6 | 2 | 3 | 1 | 0 | 4 | 5 | |
| 4 | 6 | 2 | 3 | 1 | 0 | 4 | 5 | 7 | |
| 3 | 2 | 3 | 1 | 0 | 4 | 5 | 7 | 6 | |
| 2 | 3 | 1 | 0 | 4 | 5 | 7 | 6 | 2 | |
| 1 | 1 | 0 | 4 | 5 | 7 | 6 | 2 | 3 | |
| 0 | 0 | 4 | 5 | 7 | 6 | 2 | 3 | 1 | |
| | 0 | 1 | 2 | 3 | 4 | 5 | 6 | 7 | s'(i) |

No. of ones
```
s(i) 7 | 3  2  2  1  2  1  1  0
     6 | 2  2  1  2  1  1  0  3
     5 | 2  1  2  1  1  0  3  2
     4 | 1  2  1  1  0  3  2  2
     3 | 2  1  1  0  3  2  2  1
     2 | 1  1  0  3  2  2  1  2
     1 | 1  0  3  2  2  1  2  1
     0 | 0  3  2  2  1  2  1  1
       ─────────────────────────
         0  1  2  3  4  5  6  7  s'(i)
```

No. of ones
```
s(i) 7 | 1  1  2  3  2  2  1  0
     6 | 1  2  3  2  2  1  0  1
     5 | 2  3  2  2  1  0  1  1
     4 | 3  2  2  1  0  1  1  2
     3 | 2  2  1  0  1  1  2  3
     2 | 2  1  0  1  1  2  3  2
     1 | 1  0  1  1  2  3  2  2
     0 | 0  1  1  2  3  2  2  1
       ─────────────────────────
         0  1  2  3  4  5  6  7  s'(i)
```

| s(i) | | | | | | | | |
|---|---|---|---|---|---|---|---|---|
| 7 | 4 | 5 | 6 | 7 | 3 | 2 | 1 | 0 |
| 6 | 5 | 6 | 7 | 3 | 2 | 1 | 0 | 4 |
| 5 | 6 | 7 | 3 | 2 | 1 | 0 | 4 | 5 |
| 4 | 7 | 3 | 2 | 1 | 0 | 4 | 5 | 6 |
| 3 | 3 | 2 | 1 | 0 | 4 | 5 | 6 | 7 |
| 2 | 2 | 1 | 0 | 4 | 5 | 6 | 7 | 3 |
| 1 | 1 | 0 | 4 | 5 | 6 | 7 | 3 | 2 |
| 0 | 0 | 4 | 5 | 6 | 7 | 3 | 2 | 1 |
| s'(i) | 0 | 1 | 2 | 3 | 4 | 5 | 6 | 7 |

Fig. 4b (PRIOR ART) — No. of ones

| s(i) | | | | | | | | |
|---|---|---|---|---|---|---|---|---|
| 7 | 1 | 2 | 2 | 3 | 2 | 1 | 1 | 0 |
| 6 | 2 | 2 | 3 | 2 | 1 | 1 | 0 | 1 |
| 5 | 2 | 3 | 2 | 1 | 1 | 0 | 1 | 2 |
| 4 | 3 | 2 | 1 | 1 | 0 | 1 | 2 | 2 |
| 3 | 2 | 1 | 1 | 0 | 1 | 2 | 2 | 3 |
| 2 | 1 | 1 | 0 | 1 | 2 | 2 | 3 | 2 |
| 1 | 1 | 0 | 1 | 2 | 2 | 3 | 2 | 1 |
| 0 | 0 | 1 | 2 | 2 | 3 | 2 | 1 | 1 |
| s'(i) | 0 | 1 | 2 | 3 | 4 | 5 | 6 | 7 |

Fig. 5

| s(i) | | | | | | | | |
|---|---|---|---|---|---|---|---|---|
| 7 | 4 | 5 | 7 | 6 | 2 | 3 | 1 | 0 |
| 6 | 5 | 7 | 6 | 2 | 3 | 1 | 0 | 4 |
| 5 | 7 | 6 | 2 | 3 | 1 | 0 | 4 | 5 |
| 4 | 6 | 2 | 3 | 1 | 0 | 4 | 5 | 7 |
| 3 | 2 | 3 | 1 | 0 | 4 | 5 | 7 | 6 |
| 2 | 3 | 1 | 0 | 4 | 5 | 7 | 6 | 2 |
| 1 | 1 | 0 | 4 | 5 | 7 | 6 | 2 | 3 |
| 0 | 0 | 4 | 5 | 7 | 6 | 2 | 3 | 1 |
| s'(i) | 0 | 1 | 2 | 3 | 4 | 5 | 6 | 7 |

Fig. 6a

| s(i) | | | | | | | | |
|---|---|---|---|---|---|---|---|---|
| 7 | 2 | 3 | 6 | 7 | 5 | 4 | 1 | 0 |
| 6 | 3 | 6 | 7 | 5 | 4 | 1 | 0 | 2 |
| 5 | 6 | 7 | 5 | 3 | 1 | 0 | 2 | 4 |
| 4 | 7 | 5 | 3 | 1 | 0 | 2 | 4 | 6 |
| 3 | 5 | 4 | 1 | 0 | 2 | 3 | 6 | 7 |
| 2 | 4 | 1 | 0 | 2 | 3 | 6 | 7 | 5 |
| 1 | 1 | 0 | 2 | 4 | 6 | 7 | 5 | 3 |
| 0 | 0 | 2 | 4 | 6 | 7 | 5 | 3 | 1 |
| s'(i) | 0 | 1 | 2 | 3 | 4 | 5 | 6 | 7 |

Fig. 6b — No. of ones

| s(i) | | | | | | | | |
|---|---|---|---|---|---|---|---|---|
| 7 | 1 | 2 | 2 | 3 | 2 | 1 | 1 | 0 |
| 6 | 2 | 2 | 3 | 2 | 1 | 1 | 0 | 1 |
| 5 | 2 | 3 | 2 | 2 | 1 | 0 | 1 | 1 |
| 4 | 3 | 2 | 2 | 1 | 0 | 1 | 1 | 2 |
| 3 | 2 | 1 | 1 | 0 | 1 | 2 | 2 | 3 |
| 2 | 1 | 1 | 0 | 1 | 2 | 2 | 3 | 2 |
| 1 | 1 | 0 | 1 | 1 | 2 | 3 | 2 | 2 |
| 0 | 0 | 1 | 1 | 2 | 3 | 2 | 2 | 1 |
| s'(i) | 0 | 1 | 2 | 3 | 4 | 5 | 6 | 7 |

```
          s(i) 7 | 7 7 7 7 6 3 1 0              s(i) 7 | 3 3 3 3 2 2 1 0
               6 | 6 6 6 3 3 1 0 2                   6 | 2 2 2 2 2 1 0 1
               5 | 3 3 3 4 1 0 2 1                   5 | 2 2 2 1 1 0 1 1
               4 | 5 5 4 1 0 2 4 4                   4 | 2 2 1 1 0 1 1 1
               3 | 4 4 1 0 2 4 3 3                   3 | 1 1 1 0 1 1 2 2
               2 | 2 1 0 2 4 5 5 5                   2 | 1 1 0 1 1 2 2 2
               1 | 1 0 2 5 5 6 6 6                   1 | 1 0 1 2 2 2 2 2
               0 | 0 2 5 6 7 7 7 7                   0 | 0 1 2 2 3 3 3 3
                  ─────────────────                    ─────────────────
                   0 1 2 3 4 5 6 7  s'(i)              0 1 2 3 4 5 6 7  s'(i)
                 Fig. 7a                              Fig. 7b
```

No. of ones (above Fig. 7b)

```
          s(i) 7 | 7 7 7 7 6 4 1 0              s(i) 7 | 3 3 3 3 2 1 1 0
               6 | 6 6 6 5 4 1 0 2                   6 | 2 2 2 2 1 1 0 1
               5 | 5 5 5 3 1 0 2 4                   5 | 2 2 2 2 1 0 1 1
               4 | 3 3 3 1 0 2 4 1                   4 | 2 2 2 1 0 1 1 1
               3 | 2 1 0 2 3 3 3                     3 | 1 1 1 0 1 2 2 2
               2 | 4 1 0 2 3 5 5 5                   2 | 1 1 0 1 2 2 2 2
               1 | 1 0 2 4 5 6 6 6                   1 | 1 0 1 1 2 2 2 2
               0 | 0 2 4 6 7 7 7 7                   0 | 0 1 1 2 3 3 3 3
                  ─────────────────                    ─────────────────
                   0 1 2 3 4 5 6 7  s'(i)              0 1 2 3 4 5 6 7  s'(i)
                 Fig. 8a                              Fig. 8b
```

No. of ones (above Fig. 8b)

```
          s(i) 7 | 7 7 7 7 5 6 4 0              s(i) 7 | 3 3 3 3 2 2 1 0
               6 | 3 3 5 6 6 4 0 1                   6 | 2 2 2 2 2 1 0 1
               5 | 5 5 6 2 4 0 1 2                   5 | 2 2 2 1 1 0 1 1
               4 | 6 6 2 4 0 1 2 4                   4 | 2 2 1 1 0 1 1 1
               3 | 1 2 4 0 1 2 3 3                   3 | 1 1 1 0 1 1 2 2
               2 | 2 4 0 1 2 3 5 5                   2 | 1 1 0 1 1 2 2 2
               1 | 4 0 1 3 3 5 6 6                   1 | 1 0 1 2 2 2 2 2
               0 | 0 1 3 5 7 7 7 7                   0 | 0 1 2 2 3 3 3 3
                  ─────────────────                    ─────────────────
                   0 1 2 3 4 5 6 7  s'(i)              0 1 2 3 4 5 6 7  s'(i)
                 Fig. 9a                              Fig. 9b
```

No. of ones (above Fig. 9b)

NON-REVERSIBLE DIFFERENTIAL PREDICTIVE COMPRESSION USING LOSSY OR LOSSLESS TABLES

This is a continuation of PCT application No. PCT/SE98/00652, filed Apr. 8, 1998, the entire content of which is hereby incorporated by reference in this application.

TECHNICAL FIELD

The present invention relates to a method for transforming a stream of digital numbers into a form having less entropy and which therefore is more suited for data compression, without increasing the dynamic range of the numbers, and a system for data compression.

BACKGROUND OF THE INVENTION AND PRIOR ART

In recent years, there has been an increased interest in digital audio and video communications, such as video telephony, video go conferences and other applications, e.g. digital video editing, digital broadcasting etc. The typical data is a stream of digitised samples of sound or light intensity represented as fixed-width numbers. For audio with CD quality, the samples are 16 bit numbers representing the dynamic range $[0, 2^{16}-1]=[0,65535]$. One problem with digital audio/video data is that the amount of data is enormous and requires a high bandwidth for communication and much disk space for storage. Although there has been a tremendous development in transmission/storage technologies and bandwidth is getting cheaper, digital applications still need to code the information in an efficient way using data compression. In particular, for today's and future applications in wireless communication and multimedia, data compression is very essential since the total radio-frequency bandwidth is limited, and since time constraints exist in many applications.

There are basically two different strategies that can be employed in order to compress data.

The first strategy is to reduce the statistical redundancy. This is performed by using a statistical model of the correlation between the symbols, which, for example, predicts the probability of a symbol given the preceding symbols. By doing this, one can transform a stream of more-or-less equally probable symbols, into a new stream of symbols with less correlation and a peaked probability distribution. The entropy of the source is thus greatly reduced. Entropy coding can then be used to code probable symbols using short codes, while less probable events are represented by long codes, resulting in a shorter total length of the digital stream. Such a scheme is called lossless, because no distortion is introduced in the data by the compression, and the original data sequence can hence be perfectly reconstructed.

The second strategy that is used to achieve additional compression removes some of the information and is known as lossy data compression. The aim of such a procedure is to make the distortion introduced by the lossy scheme as perceptually small as possible. Lossy data compression is used in most of the efficient audio, image, and video compression algorithms.

One common technique to code data is called Bit-Plane Coding (BPC). Given a set of digital numbers in the dynamic range $R=[0, 2^k-1]$ (for example, $R=[0, 255]$ corresponding to k=8-bit digital numbers), the numbers are reparded as k sets/planes of binary digits (bits) {0,1}. Each bit-plane corresponds to one bit in the binary representation of all the numbers. Using this standard bit-plane splitting, there remains a strong correlation between the bit-planes. This correlation can be exploited in a predictive coding scheme, for example, by coding the less significant bit planes with respect to the more significant planes. See for example, M. Rabbani, P. Melnychuck, "Conditioning Context for the Arith. Coding of Bit-Planes", IEEE trans. on Signal Proc., Vol. 40 No. 1, January 1992 and U.S. Pat. No. 5,442,448.

Another approach is to decorrelate the bit planes by applying a Gray coding of all the data values before bit-plane splitting is done. After that, the bit-planes can be coded independently with approximately the same result as for the predictive coding, but with a lower complexity.

The motivation for such a decomposition is that each bit-plane can be encoded efficiently using binary compression techniques.

Working in a binary domain reduces the complexity of the in-plane prediction model, and higher-order prediction can be used. For example, in the case of a video coding, a larger, spatial area around the element to be coded can be considered for the prediction.

Considering the bit-plane representation of ordinary natural image sequences, it is generally the case that less variation and more correlation is present between the samples in the most significant bit-planes. Hence, they can be coded more efficiently than the less significant bit-planes. From this point of view, a significant increase in the compression ratio can be achieved by doing lossy coding by neglecting the least significant bit-planes.

The compression of the most significant bit-planes, together with skipping of the least significant planes, has been used in the field of visual data compression, for example as described in the co-pending International patent application PCT/SE96/00943, which discloses an algorithm which is based on an extended BPC approach to video sequences.

If all symbols are equally probable, no (lossless) compression can be done. However, as discussed above, if one can find a statistical model to predict the data from previous values, one can construct a new sequence of symbols having a probability distribution with less variance, which can then be compressed. This corresponds to a reduction of entropy if the symbols are treated as being independent.

Consider a source of symbols, $S=\{s(1), s(2), s(3), \ldots \}$, represented as integers in the dynamic range R (s(i) is the symbol produced at the instant i). Each number has k bits, and the dynamic range is $R=[0, 2^k-1]$. Thus, if k=3, R=[0,7].

If these symbols are a set of either spatially or temporally successive samples in an audio or video sequence, they are correlated in the sense that neighbouring values are often close to each other.

A general method for exploiting this correlation is to build a new source of symbols $O=\{o(1), o(2), o(3), \ldots \}$ from the original one, whose probability distribution is much more peaked around a few values, and therefore allows a higher compression.

A known solution in the literature, is to make O the difference between successive values:

$o(1)=s(1)$ $o(i)=s(i)-s(i-1)$ from which the original sequence can be perfectly reconstructed as $s(1)=o(1)$, $s(i)=o(i)+s(i-1)$ The method is known as Differential Pulse Code Modulation (DPCM).

One way to look at s(i−1) is as a prediction of the value of s(i), and to look at o(i) as the prediction error. This is an example of exploiting first-order correlation among the data. For a stationary source, the general way of constructing O may be written as:

$$o(i)=s(i)-s'(i)$$

where s'(i) denotes the prediction which in the general case is given as:

$$s'(i)=f(s(i-1), s(i-2) \ldots )$$

where f is the function that implements the new representation.

In the following s'(i) denotes the prediction.

In the simple case of a first order correlation, a two-dimensional graphical representation of the function f can be introduced. An example with a 3-bit dynamic-range [0, 7] showing the DPCM values for each combination of s'(i)=s(i−1) and s(i) is shown in the table of FIG. 1.

Note that each (sub-)diagonal represents a specific Euclidean distance between the values s(i) and the prediction s'(i).

The histogram for o(i) for typical sources, for example audio signals, is peaked around zero due to the similarity of successive samples, and the lower variance allows an efficient coding of o(i). This implies that s'(i)=s(i−1) is a good prediction.

However, the subtraction operation used in DPCM does not preserve the dynamic range. For example, if the source symbols are characterised by 8-bit dynamic range [0,255], the output will have a doubled dynamic-range [−255, 255] corresponding to 9-bit numbers. This leads to a reduction in the compression, when, for example, a bit-plane coding approach is considered (one more bit plane is to be coded). Secondly, an increase in the complexity is introduced from the architectural point of view. One example is that architectures of ordinary digital systems are based on bytes as smallest data unit (1 byte=8 bits); and the increase in the dynamic range can then require an extension to use 2 bytes for each sample.

Furthermore, in Ying Wang, "A Set of Transformations for Lossless Image Compression", IEEE Transactions on image processing, Vol. 4, No. 5, May 1995, pp. 677–699, a transformation which preserves the dynamic range of the DPCM for a still image coding scheme is described. This paper also addresses the possibility of permuting the entry symbols in table 2a in order to code the symbols more efficiently. Examples of the corresponding tables are shown in FIGS. 3a and 4a, respectively. The corresponding number of "ones" required for coding each difference symbols are shown in FIGS. 2b, 3b and 4b, respectively. The number of ones in this case means the number of binary ones used for coding a specific symbol of the table entries. For example, if the symbol to be coded is "4", the binary representation for this symbol is "100", which contains one binary one. A reduction of the number of ones will provide a more efficient bit-plane coding.

Thus, the table in FIG. 1 shows the different coded values for different combinations of preceding and current symbol, for a data sequence having 3-bit dynamic-range and coded according to the common DPCM algorithm. If the value 8 is added to all the negative entries in the table of FIG. 1, the table shown in FIG. 2a is obtained. The table of FIG. 2a is in many cases to be preferred to the table of FIG. 1, since it provides the same information without causing any increase in the dynamic range. Thus, in the graphical representation this means that only numbers in the original dynamic-range occur in the table 2a.

Furthermore, the tables 3a and 4a are modifications of FIG. 2a also showing invertible, permutative codes.

Invertible in this case means that the table is a group multiplication table and that the sequence can be decoded in reverse order, i.e. the sequence is reversible. Permutative means that the structure of the codes is the same as the structure shown in FIG. 2a, but the entry symbols have been permuted.

SUMMARY OF THE INVENTION

It is an object of the present invention to improve the compression possible to obtain with the prior art and it is also an object to apply such schemes for compression of video and audio sequences.

These objects and others are obtained by means of a general method exploiting the correlation existing among digital values, while preserving the dynamic range. The method is based upon the observation that the coding schemes as described in the prior art do not remove all redundancy from the coding. Hence, there still exist reversible relations between consecutive samples.

Thus, by constructing differential coding algorithms which are not in any sense reversible, a much more flexible coding algorithm can be obtained. The flexibility is used for designing the coding algorithm in such a manner that the output becomes possible to compress at as high compression ratios as possible.

In another aspect of the invention, the differential coding algorithm is used in a lossy environment. In some applications the original sequence does not need to be perfectly reconstructed in order to obtain an acceptable result.

BRIEF DESCRIPTION OF THE DRAWINGS

The present invention will now be described in more detail by way of a non-limiting embodiment, and with reference to the accompanying drawings, in which:

FIG. 1 shows a prior art table used for DPCM.

FIGS. 2a and 2b show prior art tables used for a DPCM algorithm preserving the dynamic range and the corresponding number of ones required.

FIGS. 3a and 3b show prior art tables similar to those shown in FIGS. 2a and 2b.

FIGS. 4a and 4b show prior art tables similar to those shown in FIGS. 2a and 2b.

FIG. 5 shows a table used for differential coding.

FIGS. 6a and 6b show tables used for differential coding and minimizing the number of ones.

FIGS. 7a and 7b show table examples of a non-invertible code.

FIGS. 8a and 8b are tables similar to the tables of FIGS. 7a and 7b, in which the clustering is maximized.

FIGS. 9a and 9b are tables similar to those shown in FIGS. 8a and 8b, but asymmetric.

FIG. 10 is a table similar to the table of FIG. 7.

FIG. 11 is the inverse of FIG. 10.

FIG. 12 is a table similar to that of FIG. 10.

FIG. 13 is an example of an table having dynamic increasing/decreasing of zeroing.

DESCRIPTION OF PREFERRED EMBODIMENTS

Figures 1, 2A, 2B, 3A, 3B:
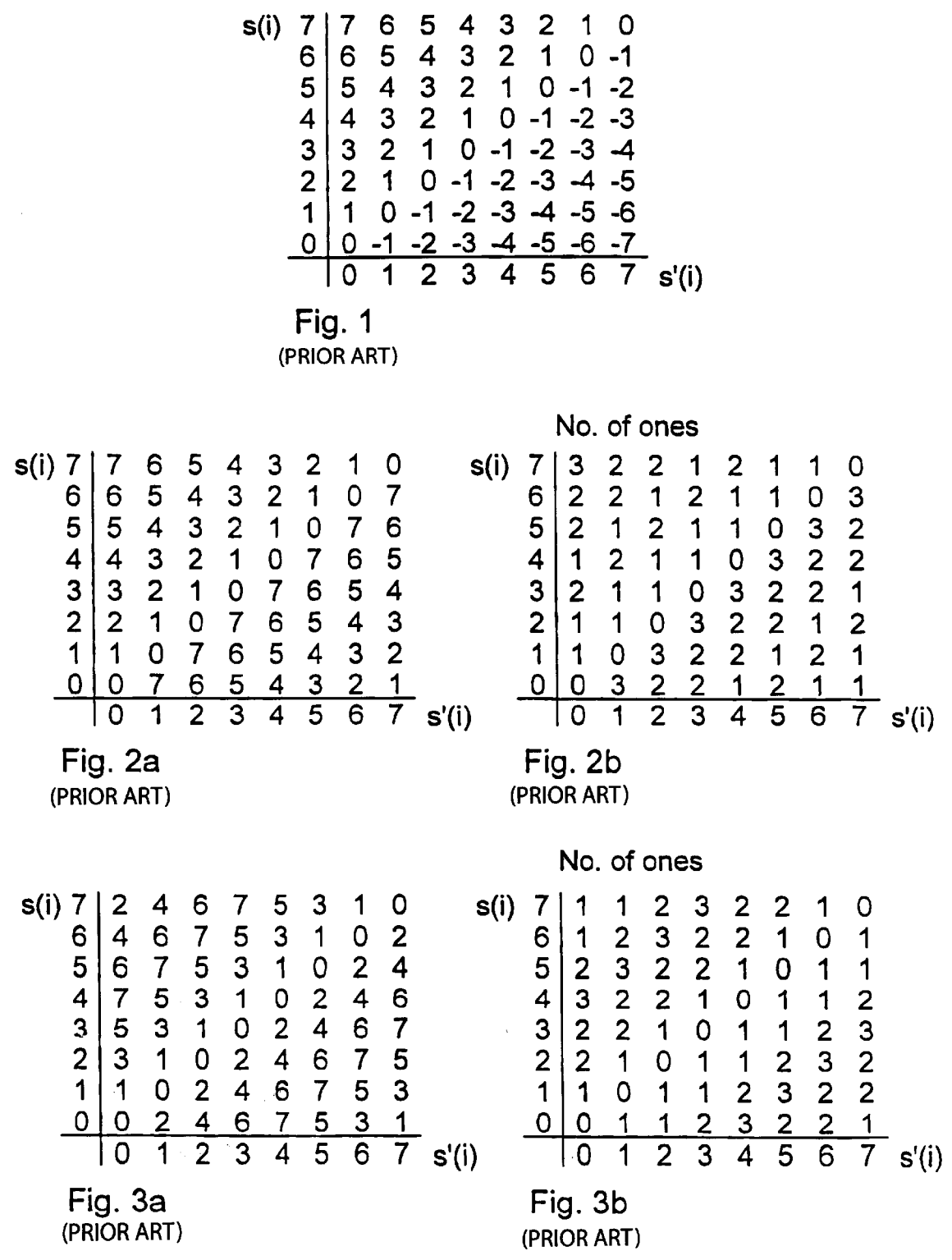

In general, there are many ways of constructing invertible permutative relations. However, in the case when the object is to obtain an output stream compressed as much as possible, the table should be chosen in such a way as to optimise the output stream O with respect to the aim of the procedure. For example, to decorrelate the bit planes of O, one can Gray code the entries of the table of FIG. 2a, leading to the table of FIG. 5. Such a table would provide a much better output stream from a compression point of view and would therefore be preferable to the tables shown in the FIGS. 2a, 3a, and 4a.

In FIG. 6a, an even better embodiment, where the table is an invertible non-permutative code, is shown. The table of FIG. 6a is better in the sense that small differences are coded with a minimum number of ones, see FIG. 6b, which hence increases the compression ratio. The property being exploited in this case is that the statistical distribution function for the pair [s(i), s'(i)] is strongly peaked around the main diagonal s(i)=s'(i), with decreasing probability for the sub-diagonals. This exploitation is possible due to the code resulting from the non-permutative way in which the code is designed.

Thus, the respective sub-diagonals in the table 6a, as a difference to the tables in the FIGS. 2–5, does not consist of identical symbols. This property, i.e. having different symbols along the respective sub-diagonals, allows for a more flexible and optimal coding of the difference symbols.

The tables of FIGS. 2a–6a correspond to "group multiplication tables" and are invertible because each number occurs only once in every row and column. The perfect reconstruction of S from O is therefore guaranteed. The tables 2–5 are furthermore permutative, i.e. they have identical symbols along the respective sub-diagonals, whereas the table 6a is non-permutative, i.e. some of the symbols along a particular sub-diagonal are different from each other. This invertible property may be advantageous in some applications.

However, in data compression the aim is to compress a sequence of data symbols to a minimum. Depending on the requirements of a particular application the compression can be either lossless or lossy. In both of these cases the differential coding according to the prior art, for example designed according to the tables of FIGS. 1–4, has been found to not be optimal.

The results provided by the coding according to the techniques of tables 5 and 6a can in this sense also be further improved.

This has been found to be due to the fact that these tables give more information than necessary, i.e. the methods as described in conjunction with FIGS. 1–4 and also in conjunction with FIGS. 5 and 6a do not remove all redundant information. Thus, it has been found that given o(i), one can reconstruct s(i) from s(i−1)i but one can also reconstruct s(i−1) from s(i). Thus, one can perform either a forward or backward decoding of the symbol stream, i.e. an invertible table corresponds to reversible decoding.

Since, in normal coding applications, only the forward reconstruction of s(i) from s(i−1) and o(i) is used, the group-multiplication structure of the Tables shown in FIGS. 2a–6a are unnecessarily constrained and contains information not needed.

Thus, given that s(i−1) has already been reconstructed when the reconstruction of s(i) begins, the only condition on the o(i) table is that each number in the range R should occur exactly once in each column. In other words, each column should be a permutation of R. There is no constraint on the distribution of the numbers in each row, as there would be for an ordinary group multiplication table. An example of a table designed according to this method is shown in FIG. 7a.

This most general relation guaranteeing perfect reconstruction of the original signal can thus be written as:

$$o(i)=f_{s'(i)}(s(i)),$$

where each $f_{s'(i)}$ (x) represents a permutation of R.

For simplicity, only one prediction value s'(i) was used in the argument above. However, the method can easily be generalised to more complex cases by choosing the permutation depending on two, three etc. prediction values. The corresponding graphical representations would then be three-, four-dimensional etc.

The method is general and can be applied under many different conditions. The constraint of each column being a permutation, gives large freedom for tuning the coding for a particular application. The case of bit plane coding is particularly interesting.

The method can, for example, be applied in the case of coding of bit-plane coded video sequences. The original data stream is than a sequence of matrices of digital numbers, where each matrix corresponds to one frame, and where the digital numbers ranges from 0 to 7. In this example the temporal correlation is addressed, and the consecutive digital values s(1),s(2), . . . of one specific pixel at instant 1, 2, . . . are considered as the source S. For ordinary video sequences (without scene changes), consecutive samples are highly correlated and the absolute difference |s(i)−s(i−1)| is strongly peaked around zero. Most data streams originating in the sampling of a continuous signal show similar correlation. This is, for example, the case for the spatial correlation within one frame of the image sequence, and for an ordinary audio stream. As an alternative one can use the in-plane prediction s'(i).

If one wants to code the sequence by applying a Bit-Plane Coding technique, such as in the case of the cited International patent application PCT/SE96/00943, a table of the type shown in FIG. 7a can be designed in order to maximise the compression ratio. Different strategies can then be used. one strategy is to generate a signal O, so that the total number of ones in the bit planes is as small as possible, at the same time as the correlation between the bit planes is made small.

If s'(i) is a good prediction, the pair (s(i),s'(i)) is strongly peaked around the main diagonal s(i)=s'(i), with a decreasing probability for the sub-diagonals. This is also the case in this example where s'(i)=s(i−1). In order to minimise the total number of ones, the code values having the smallest number of ones in their binary representation are placed closest to the diagonal.

An example of a possible table is shown in FIG. 7a. The corresponding number of ones is shown in the table of FIG. 7b.

This guarantees a fairly successful coding of the bit planes, but, in general, one will have to tune the transformation used together with the actual bit plane coding algorithm.

Furthermore, FIG. 8a shows an example of a non-invertible code which minimises the number of ones and maximises the size of the clusters of ones in the bit-planes as seen in FIG. 8b. The table in FIG. 8a is no longer a group multiplication table, since entries are repeated within the individual rows.

In FIG. 9a, which is similar to FIG. 8a, the symmetry of ones along the diagonal is removed, see FIG. 9b, which is advantageous in some applications.

The method as described herein can also be applied as a method for obtaining an efficient lossy compression of data.

Thus, above, the method was used as a lossless scheme. This means that a perfect reconstruction of the input data sequence is guaranteed. To achieve even higher compression, the method can be generalised to a lossy case by omitting the condition that each column has to be a permutation of the range R.

In the lossy case, each column is allowed to consist of any subset of R. One interesting case is the one where the sub-diagonals of the table of FIG. 7a corresponding to |s(i)−s'(i)|=1 are set to '0'. The resulting table is shown in the table of FIG. 10.

Figures 10, 12, 13:
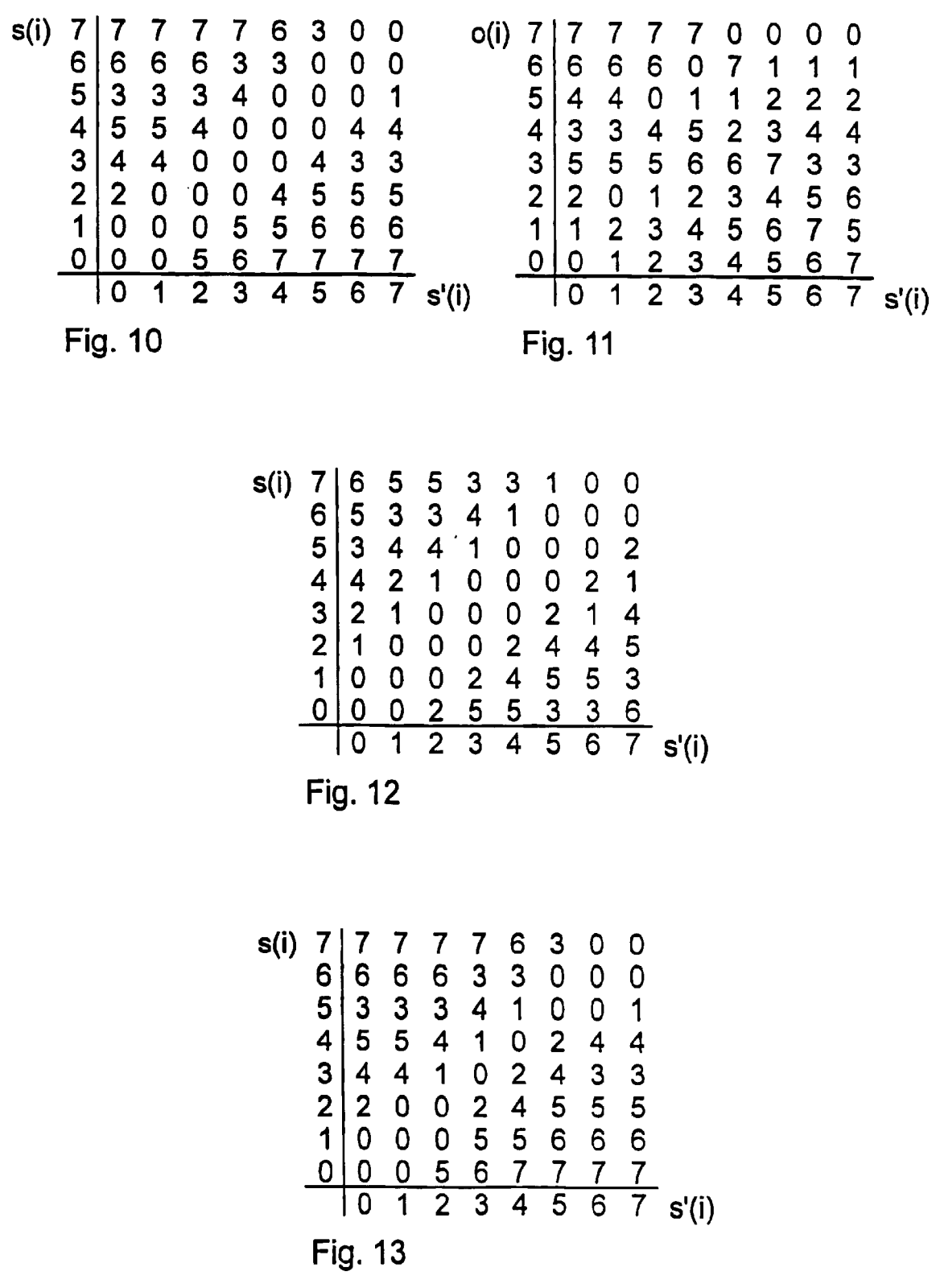

An important element, when applying a lossy table, such as the one of FIG. 10, is that the reconstructed value of s'(i), denoted s'(i), is to be used instead of s'(i), in order to avoid drifting of the reconstructed value with respect to s(i).

In the case of a lossy transformation table, the inverse table is not non-ambiguously defined, but has to be explicitly specified. One must choose one reconstructed value for each group of degenerate values in each column. In the case of the table of FIG. 10, one can use the inverse of the lossless table in FIG. 7a, which means that the diagonal is perfectly reconstructed. That inverse table is shown in the table of FIG. 11. The only difference in the lossy case, is that certain combinations of s'(i) and o(i) will never occur, and are irrelevant to the lossy case.

To illustrate the lossy case, consider the sample sequence s(i): 2 4 5 7 2 3 5 3
which will be reconstructed as, if the table of FIG. 6 is used:
s(i): 2 4 4 7 2 2 5 3

The method allows large freedom in the design of the tables, and can lead to a big increase in compression ratio. In the specific case described above, where the absolute difference |s(i)−s(i−1)| is used, which is strongly peaked around zero, the application of the table of FIG. 10 leads to a big decrease in the total number of ones.

From the qualitative point of view, the loss in quality by introducing this particular lossy scheme can be efficiently controlled. Thus, once errors grow above a threshold, the correct value is recovered. In particular, in the scheme introduced in the table of FIG. 6a, a threshold of 1 is applied.

For example, in the case described above in conjunction with video coding application where s'(i) and s(i) are pixel values in the same position in successive frames, the method results in a loss of information in certain pixels at some instants, so that a distortion from a visual point of view is introduced.

However, losses are introduced only along the sub-diagonals. Therefore the loss of quality is limited and not too much annoying from a visual point of view.

Compression can be increased even more with respect to the case of FIG. 10 by means of modifying the table in the manner shown in FIG. 12. In FIG. 12 no symbol corresponds to three ones. This is obtained by means of exchanging the symbol corresponding to three ones with another symbol, which is possible in this case since the symbol range has been reduced due to the introduction of lossy coding.

Another advantage of the lossy scheme is that it allows the introduction of bit-rate control. This is achieved by applying the method as a more flexible scheme, where not complete subdiagonals are zeroed but only some elements thereof. The number of zeros in the sub-diagonals is dynamically increased or decreased according to the requirements on quality/compression. Such a technique is illustrated in FIG. 13, where zeroing of the first sub-diagonals is partly introduced, compare to FIG. 7a and FIG. 12.

In this manner a graceful degradation of the quality can be achieved when the load on the channel used increases/decreases. Hence, when the channel over which data is transmitted is used for other traffic, the method described in conjunction with FIG. 13 provides a very efficient coding which can adapt to the bandwidth currently available.

A further application is to smoothen the signal by putting in a maximum step in the dynamic range preserving table, so that all differences bigger than, for example, 5 are mapped to 5.

The method as described herein can exploit correlation in a stream of digital numbers without increasing the dynamic range of the numbers. It therefore serves as an efficient first step in coding digital data.

Furthermore, the method is very general and can be adapted to very different strategies and applications. In particular, it has been found to be very efficient in connection with entropy coding schemes, such as the ones based on bit-plane coding, where the possibility of exploiting the correlation among the elements without increasing the dynamic range is important.

The method is also possible to apply both in a lossless case as well as in a lossy one, the method then leaving large possibility for designing optimal tables for a specific application.

Under lossy condition the method allows for a very high compression. The lossy tables can also be used to achieve bit-rate control, as well as for smoothening the signal. It can further be used for on-line fine tuning of the coding scheme.

From a computational point of view, the method is very cheap. It can be implemented through a simple look-up table.

The method can be used for coding any stream of digital numbers having a fixed range. It is particularly useful for coding audio, image, and video streams where a continuous signal has been digitalized and when strong correlations exist between neighbouring samples, or in other cases where an efficient prediction can be implemented. It can easily be generalised beyond first-order correlations, by introducing multi-dimensional look-up tables.

What is claimed is:

1. A method of lossless coding of a sequence of data symbols to be transmitted or stored, the method comprising the steps of:
    coding each symbol with a dynamic range preserving difference symbol representing a difference between a current symbol and a predicted symbol so that the coded symbol or an estimate of the coded symbol can be determined having knowledge of the predicted symbol and of the difference symbol, and
    coding said difference symbol in a non-reversible manner so that a preceding symbol cannot be uniquely determined by the coded symbol and the difference symbol in order to provide lossless coding of the sequence of data symbols.

2. A method according to claim 1, further comprising representing difference symbols associated with small prediction errors with few binary ones in relation to large prediction errors.

3. A method according to claim 2, further comprising obtaining the predicted symbol using an immediately preceding decoded symbol.

4. A method according to claim 1, further comprising obtaining the predicted symbol using a preceding decoded symbol.

5. A method of lossy coding of a sequence of data symbols, which is to be transmitted or stored, the method comprising:
    coding each symbol with a dynamic range preserving difference symbol representing a difference between a current symbol and a predicted symbol so that the coded symbol or an estimate of the coded symbol can be determined having knowledge of the predicted symbol and of the difference symbol, and coding said difference symbol in a non-reversible manner so that a preceding decoded symbol cannot be uniquely determined by the coded symbol and the difference symbol in order to provide lossy coding of the sequence of data symbols;

utilizing the predicted symbol as the correct current symbol when the difference between the predicted symbol and the current symbol is smaller than a first predetermined value; and changing first and/or second predetermined value(s) respectively according to a momentary bandwidth available on a channel used for transmitting the difference symbols.

6. A method according to claim 5, further comprising obtaining the predicted symbol using an immediately preceding decoded symbol.

7. A coding device for lossless coding of a sequence of data symbols, which is to be transmitted or stored, comprising:

means for coding in a lossless manner each symbol with a dynamic range preserving difference symbol representing a difference between a current symbol and a predicted symbol so that the coded symbol or an estimate of the coded symbol can be determined with knowledge of the predicted symbol and of the difference symbol, and means for coding said difference symbol in a non-reversible manner so that a preceding symbol cannot be uniquely determined by the coded symbol and the difference symbol.

8. A device according to claim 7, further comprising means for coding difference symbols associated with small prediction errors with few binary ones in relation to difference symbols associated with large prediction errors.

9. A device according to claim 8, in the case when the coding is lossy, characterized by means for coding the current symbol as the predicted symbol, if the difference between the predicted symbol and the current symbol is smaller than a first predetermined value.

10. A device according to claim 8, in the case when the coding is lossy, characterized by means for coding the current symbol as the difference symbol associated with a second predetermined value, if the difference between the predicted symbol and the current symbol is larger than a second predetermined value.

11. A device according to claim 8, characterized by means for obtaining the predicted symbol using an immediately preceding decoded symbol.

12. A device according to claim 7, further comprising:

means for coding the current symbol as the predicted symbol, if the difference between the predicted symbol and the current symbol is smaller than a first predetermined value.

13. A device according to claim 12, further comprising:

means for changing the first predetermined value according to a momentary bandwidth available on a channel used for transmitting the difference symbols.

14. A device according to claim 13, characterized by means for obtaining the predicted symbol using an immediately preceding decoded symbol.

15. A device according to claim 12, in the case when the coding is lossy, characterized by means for coding the current symbol as the difference symbol associated with a second predetermined value, if the difference between the predicted symbol and the current symbol is larger than a second predetermined value.

16. A device according to claim 12, characterized by means for obtaining the predicted symbol using an immediately preceding decoded symbol.

17. A device according to claim 7, further comprising:

means for obtaining the predicted symbol using a preceding decoded symbol.

18. A device according to claim 7, characterized by means for changing a first predetermined value according to a momentary bandwidth available on a channel used for transmitting the difference symbols.

19. A method of lossless or lossy coding of a sequence of data symbols, which is to be transmitted or stored, comprising:

coding each symbol by way means of a non-permutative group multiplication table, with a dynamic range preserving difference symbol representing a difference between a current symbol and a predicted symbol so that the coded symbol or an estimate of the coded symbol can be determined with knowledge of the predicted symbol and of the difference symbol.

20. A method according to claim 19, further comprising obtaining the predicted symbol using a preceding decoded symbol.

21. A device for lossless or lossy coding of a sequence of data symbols, which is to be transmitted or stored, characterized by means for coding each symbol with a dynamic range preserving difference symbol representing a difference between a current symbol and a predicted symbol so that the coded symbol or an estimate of the coded symbol can be determined with knowledge of the predicted symbol and of the difference symbol, and means for coding said difference symbol by means of a non-permutative group multiplication table.

22. A device according to claim 21, characterized by:

means for obtaining the predicted symbol using a preceding decoded symbol.

* * * * *